United States Patent [19]

Ohta

[11] Patent Number: 5,483,086
[45] Date of Patent: Jan. 9, 1996

[54] FOUR LAYER SEMICONDUCTOR SURGE PROTECTOR HAVING PLURAL SHORT-CIRCUITED JUNCTIONS

[75] Inventor: Koichi Ohta, Hanno, Japan

[73] Assignee: Shindengen Electric Manufacturing Co., Ltd., Tokyo, Japan

[21] Appl. No.: 469,423

[22] Filed: Jun. 6, 1995

Related U.S. Application Data

[63] Continuation of Ser. No. 388,892, Feb. 14, 1995, abandoned, which is a continuation of Ser. No. 224,131, Apr. 6, 1994, abandoned, which is a continuation of Ser. No. 49,423, Apr. 20, 1993, abandoned.

[51] Int. Cl.$^6$ .......................... H01L 29/74; H01L 31/111
[52] U.S. Cl. ...................... 257/111; 257/109; 257/112; 257/173; 361/56; 361/91; 361/100
[58] Field of Search ...................... 257/109, 111, 257/112, 173, 174; 361/56, 91, 100

[56] References Cited

U.S. PATENT DOCUMENTS

| | | | |
|---|---|---|---|
| 2,971,139 | 2/1961 | Noyu | 257/109 |
| 4,282,555 | 8/1981 | Svedberg | 361/56 |
| 4,644,437 | 2/1987 | Robe | 361/56 |
| 4,905,119 | 2/1990 | Webb | 361/119 |
| 4,967,256 | 10/1990 | Pathak et al. | 357/38 |
| 5,352,905 | 10/1994 | Ohta | 257/111 |

FOREIGN PATENT DOCUMENTS

| | | | |
|---|---|---|---|
| 0194936 | 9/1986 | European Pat. Off. | 257/109 |
| 2566582 | 12/1985 | France | 257/109 |
| 54-22179 | 2/1979 | Japan | 257/112 |
| 1-218066 | 8/1989 | Japan | 257/109 |

*Primary Examiner*—Ngân V. Ngô
*Attorney, Agent, or Firm*—Finnegan, Henderson, Farabow, Garrett & Dunner

[57] ABSTRACT

A thyristor type surge protector having a breakdown voltage $V_{BO}$ approximately equal to a surge clamping voltage $V_{CL}$ includes a P-type first semiconductor layer, an N-type second semiconductor layer provided in one surface of the first semiconductor layer, a P-type third semiconductor layer provided in the second semiconductor layer so as to provide at least one first exposed region of the second semiconductor layer, and an N-type fourth semiconductor layer formed in the other surface of the first semiconductor layer so as to provide at least one exposed region of said first semiconductor layer, a first electrode provided over the third semiconductor layer and of the first exposed region, and a second electrode provided over the fourth semiconductor layer and second exposed region.

20 Claims, 6 Drawing Sheets

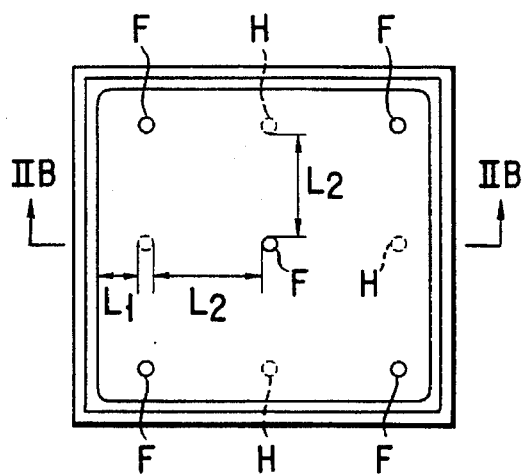
F I G. 2A
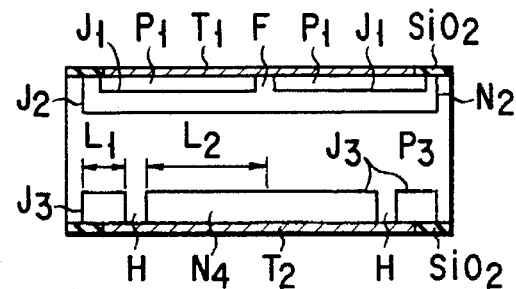
F I G. 2B
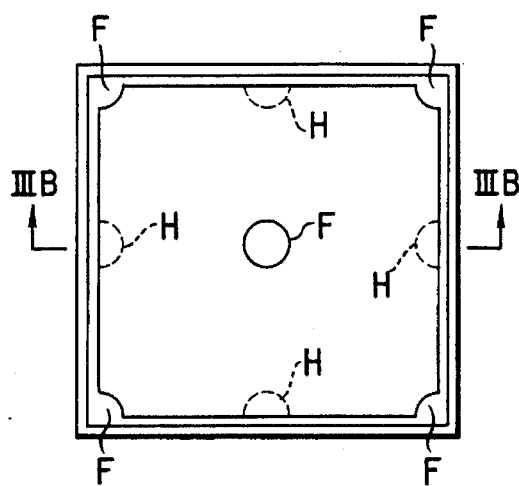
F I G. 3A
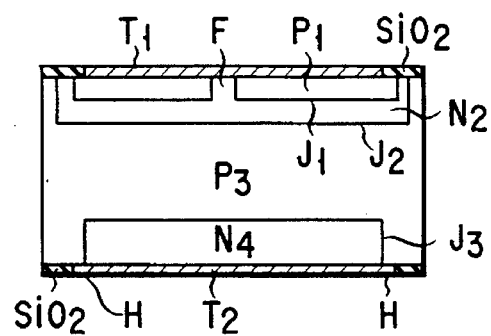
F I G. 3B

F I G. 5A
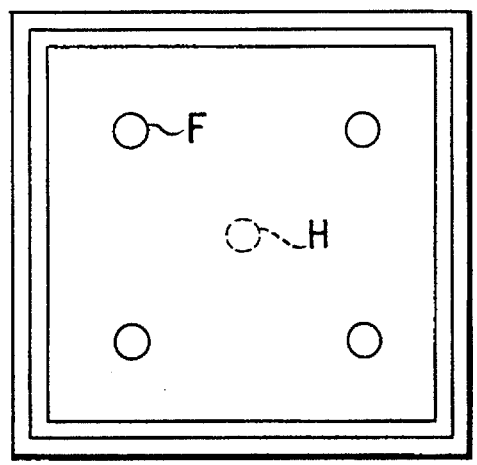
F I G. 5B
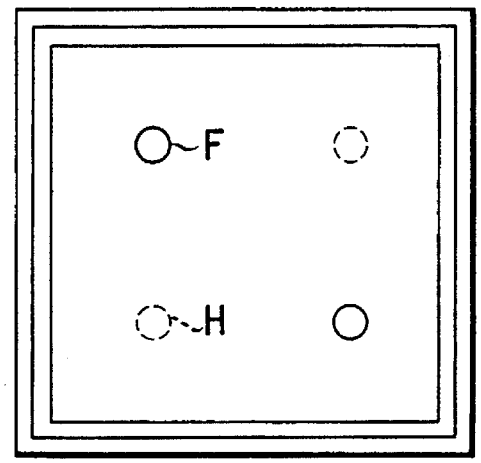
F I G. 5C
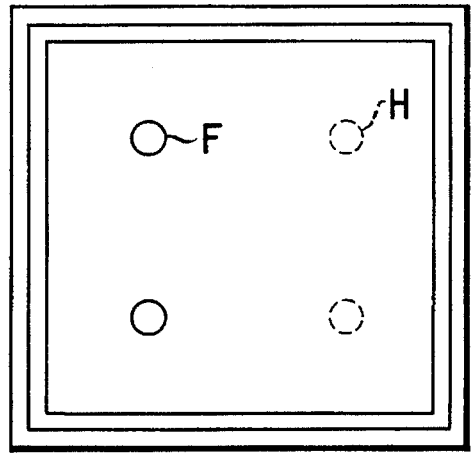

FOUR LAYER SEMICONDUCTOR SURGE PROTECTOR HAVING PLURAL SHORT-CIRCUITED JUNCTIONS

This application is a continuation of application Ser. No. 08/388,892, filed Feb. 14, 1995, now abandoned, which is a continuation of Ser. No. 08/224,131, filed Apr. 6, 1994, now abandoned, which is a continuation of application Ser. No. 08/049,423, filed Apr. 20, 1993, now abandoned.

BACKGROUND OF THE INVENTION

1. Field of the Invention

The present invention relates to a two-terminal surge protector suitable for protecting electronic circuits of various communication equipments from surge currents.

2. Description of the Related Art

In order to protect circuits of various electronic equipments from surge currents, a thyristor type two-terminal surge protector having a small size and a high speed operation has been used. In the thyristor type two-terminal surge protector, a thyristor having four layers of $P_1N_2P_3N_4$ shown in FIG. 7A or a thyristor having a $P_1$ layer and an $N_2$ layer partially shorted as shown in FIG. 7B has been known. These thyristors have voltage(v)-current(I) characteristics (a) and (b) having a breakdown voltage $V_{BO}$ as shown in FIG. 7C. However, although a holding current $I_{H2}$ of the thyristor having the short-circuited structure is larger than a holding current $I_{H3}$ of the thyristor having no short-circuited structure, the breakdown voltage $V_{BO}$ of each of the protectors is lower than a breakdown voltage $V_B$ of a junction $J_2$.

In order to protect an electronic circuit from a surge current by using the above thyristor type surge protector, as shown in FIG. 8A, a surge protector Z is connected between lines $L_1$ and $L_2$ in parallel with an electronic circuit G. In addition, in order to protect the electronic circuit from a bidirectional surge current S, as shown in FIG. 8B, the surge protector Z is connected between the lines $L_1$ and $L_2$ to which an electronic circuit G is connected through a diode bridge circuit DB. For protecting the electronic circuit G, having N Lines $L_1$ to $L_N$, from negative and positive bidirectional surge currents, one surge protector Z is commonly connected to the lines $L_1$ to $L_N$ each through diodes $D_1$ and $D_2$, respectively, as shown in FIG. 8C.

When the surge voltage S applied to the lines exceeds the breakdown voltage $V_{BO}$, the surge protector Z is turned on to cause a current to flow through the protector Z. The protector Z protects the electronic circuit G such that a voltage higher than the breakdown voltage $V_{BO}$ is not applied to the electronic circuit G. In fact, when a rise time dv/dt of the surge voltage S is high, as will be described later, the protector Z is turned on at an operating voltage (clamping voltage) $V_{CL}$ higher than the breakdown voltage $V_{BO}$. The surge current flows through the surge protector Z to decrease the current flowing through the electronic circuit. When the current drops to the holding current $I_H$, the protector Z returns to its normal nonconductive state, the current given by a line impedance R and a bias voltage E flows through the electronic circuit. The protector Z is thus prepared for a next surge current.

For carrying out more preferable protection by using the above two-terminal surge protector, the following conditions must be satisfied.

(1) In order to improve a breaking performance, the holding current $I_H$ is increased such that a relationship between the holding current $I_H$ and a current E/R given by the circuit impedance R and the bias voltage E satisfies a condition of $I_H > E/R$.

(2) A withstand surge current is increased.

(3) The capacitance of the surge protector connected between the lines is reduced to decrease the capacitance to be connected therebetween, thereby preventing degradation of communication performance caused by attenuation of a transmission signal.

(4) The surge operating voltage $V_{CL}$, which is caused by increasing the rise time of the surge voltage and is increased by a breakdown voltage (DC blocking voltage) $V_{BO}$, is decreased, thereby reducing the surge voltage applied to the electronic circuit G.

That is, in the structure of FIG. 7A, when the current amplification factors of transistors $N_4P_3N_2$ and $P_1N_2P_3$ are represented by $\alpha_1$ and $\alpha_2$, and a breakdown voltage of a junction between $N_2$ and $P_3$ is represented by $V_B$, the breakdown voltage $V_{BO}$ is given by:

$$V_{BO} \cong V_B\{1-(\alpha_1+\alpha_2)\}^{1/n}$$

(where $n \cong 2$ to 6)

In the structure of FIG. 7B, the breakdown voltage $V_{BO}$ is approximately given by:

$$V_{BO} \cong V_B(1-\alpha_1)^{1/n}$$

For this reason, in either structures, as indicated by the characteristics (a) and (b) in FIG. 7C, $V_{BO} < V_B$ is obtained, so that the voltage $V_{BO}$ is lower than the voltage $V_B$.

When the rise time of the normal surge voltage, i.e., the rise time dv/dt becomes about 100/µs, the surge operating voltage $V_{CL}$ becomes equal to the voltage $V_B$. Therefore, $$V_{CL}(=V_B) > V_{BO}$$

is obtained.

In order to obtain more preferable surge protection performance, $V_{CL} = V_{BO}$ is desirably satisfied while a decrease in voltage $V_{BO}$ is prevented as much as possible.

When each of the thyristor type surge protectors shown in FIG. 7A and 7B is turned on to allow the surge current of about 100 A to flow therethrough, both of them are not affected by the short-circuited structure, i.e., the withstand surge is not changed. However, when the current is decreased to about 100 mA to turn off such protectors after the surge current passes through, they are affected by the short-circuited structure. Therefore, the protector having the short-circuited structure is turned off by a current larger than that of the surge protector which has no short-circuited structure. That is, as shown by the characteristics (a) and (b), the turn-off current, i.e., the holding current $I_H$ is increased from $I_{H3}$ to $I_{H2}$ in accordance with the presence/absence of the short-circuited structure.

In addition, the above conditions have a strict trade-off relationship in design of the protector. That is, by defining the impurity concentration, thickness, and the like of the $P_1N_2P_3 N_4$ layers shown in FIG. 7A, the amplification factors $\alpha_1$ and $\alpha_2$ of the transistors can be reduced to suppress a decrease in the breakdown voltage $V_{BO}$ from the voltage $V_B$. In this case, however, the withstand surge current is decreased.

when the capacitance of the surge protector is decreased to prevent the degradation of communication performance, the voltage $V_{BO}$ is increased. In the conventional structures, it is difficult to eliminate the trade-off relationship and to satisfy all of the conditions described above.

SUMMARY OF THE INVENTION

It is, therefore, an object of the present invention to provide a semiconductor surge protector having improved breaking and surge protection performances.

It is another object of the present invention to provide a semiconductor surge protector having a large holding current $I_H$.

It is still another object of the present invention to provide a semiconductor surge protector having a breakdown voltage $V_{BO}$ almost equal to a surge operating voltage $V_{CL}$.

According to one aspect of the present invention, there is provided a semiconductor overvoltage protector, which includes a first semiconductor layer of one conductivity type, a second semiconductor layer of an opposite conductivity type provided in one surface of the first semiconductor layer, a third semiconductor layer of one conductivity type formed in the second semiconductor layer so as to provide a first exposed region of the second semiconductor layer, a fourth semiconductor layer of opposite conductivity type formed in the other surface of the first semiconductor layer so as to provide a second exposed region of the first semiconductor layer, a first electrode provided over the third semiconductor layer and the first exposed region, and a second electrode provided over the fourth semiconductor layer and the second exposed region.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 2A is a plan view showing a semiconductor surge protector according to a second embodiment of the present invention;

FIG. 2B is a sectional view showing the semiconductor surge protector along a line IIB—IIB in FIG. 2A;

FIG. 3A is a plan view showing a semiconductor surge protector according to a third embodiment of the present invention;

FIG. 3B is a sectional view showing the semiconductor surge protector along a line IIIB—IIIB in FIG. 3A;

FIGS. 5A to 5C are plan views showing a semiconductor surge protector according to a fifth embodiment of the present invention;

DETAILED DESCRIPTION OF THE PREFERRED EMBODIMENTS

Figure 1A:
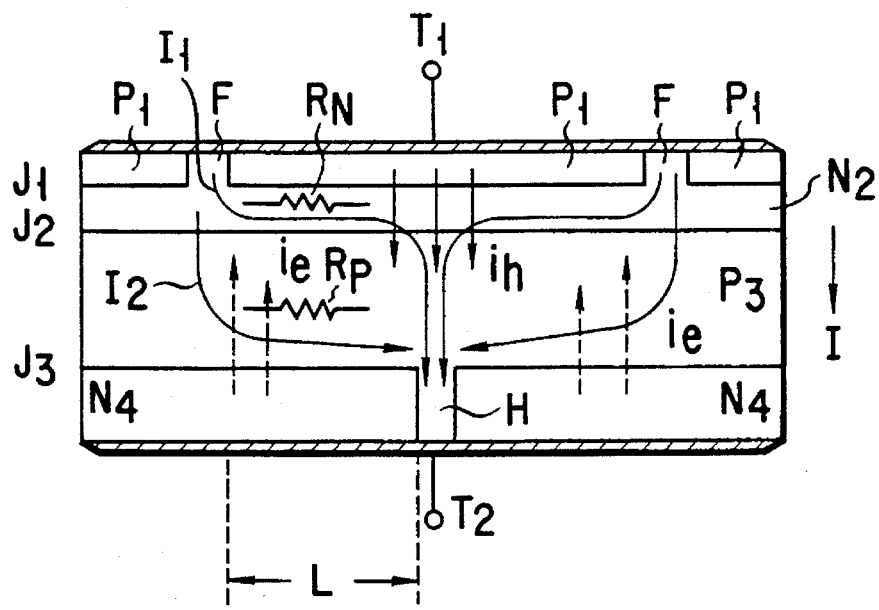
FIG. 1A is a plan view showing a semiconductor surge protector according to a first embodiment of the present invention.

Embodiments of the present invention will be described below with reference to the accompanying drawings.

In the following description, the same reference numerals denote the same parts throughout the accompanying drawings.

A semiconductor surge protector according to the first embodiment of the present invention will be described below with reference to FIGS. 1A and 1B.

As shown in FIG. 1A, using a $P_3$ layer as a common substrate, an $N_2$ layer is provided on one surface of the $P_3$ layer, and an $N_4$ layer is formed on the other surface. A $P_1$ layer is formed on the $N_2$ layer to expose a plurality of circular $N_2$ regions F having a diameter d. Similarly, an $N_4$ layer is provided on the $P_3$ layer to expose a circular $P_3$ region H having a diameter. In this case, as shown in FIG. 1A, each of the exposed $N_2$ regions F are separated from the $P_3$ region H by a distance L, and the exposed $N_2$ regions F and $P_3$ region H are arranged to be opposed to the $N_4$ layer and $P_1$ layer, respectively. In addition, an electrode $T_1$ is provided over the exposed $N_2$ regions F and $P_1$ layer, and an electrode $T_2$ is formed over the exposed $P_3$ region H and $N_4$ layer.

If the diameter of each of the exposed $N_2$ regions F or the $P_3$ region H is small, a short-circuiting effect is decreased due to an increase in spreading resistance. On the contrary, if the diameter d is extremely large, an effective area is decreased. The diameter d may be usually given by about 50 to 200 μm.

As described above, according to the present invention, the semiconductor surge protector has the four-layer structure consisting of $P_1$, $N_2$, $P_3$, and $N_4$ layers, in which parts of the $N_2$ and $P_3$ layers extend through the $P_1$ layer and the $N_4$ layer to the upper and lower surfaces of the structure, respectively, and the exposed regions are electrically coupled to the $P_1$ and $N_4$ layers by the metal electrodes $T_1$ and $T_2$, thereby providing a short-circuited structures F and H.

With the above arrangement, as will be apparent from the following operation, the breakdown of the surge protector depends on a breakdown voltage $V_B$ of only a junction $J_2$ between the $N_2$ layer and the $P_3$ layer, thereby providing the relationship between the breakdown voltage $V_{BO}$ and the surge operating voltage $V_{CL}$ given by $V_{BO}=V_{CL}$.

The operation will be described below together with the voltage-current characteristic shown in FIG. 1B.

When a voltage V is applied across the metal electrodes $T_1$ and $T_2$ in such a manner that the metal electrode $T_1$ is positive with respect to the metal electrode $T_2$, the junction $J_2$ is reverse biased. When the surge voltage exceeds the breakdown voltage of the junction $J_2$, a current I begins to flow. At this time, current components $I_1$ and $I_2$ of the current I flow through the $N_2$ layer and $P_3$ layer, respectively, so that voltage drops occurs by lateral effective resistances $R_N$ and $R_p$, respectively. The junction $J_1$ and a junction $J_3$ are then forward biased by the voltage drops.

The above forward bias voltages are increased with an increase in the current. In this case, when the voltages exceed the forward rise voltages of the junctions $J_1$ and $J_3$, the current begins to flow through the junctions $J_1$ and $J_3$, resulting in injections of holes ih and electrons ie, respectively. Therefore, when the current I becomes large, the surge protector switches to a conductive state. The ON-state is maintained by the holes ih and the electrons ie, and is caused in the entire area of the protector except short-circuited structures F and H. That is, in the ON-state, although portions near the short-circuited structures F and H operate as fields for recombining the injected carriers, the influence of the recombination can be neglected in a large current state (the peak value of the normal surge current is several 10 to several 100 A).

When the surge current passes through the protector to decrease the current together with the wave tail of the surge current, the ON-state cannot be kept at a certain current (holding current $I_{H1}$), so that the surge protector is turned off. In this case, the protector is affected by the recombination in the short-circuited structures F and H at the current $I_{H1}$ (about 100 mA).

For this reason, the surge protector is turned off at the current larger than each of currents $I_{H2}$ and $I_{H3}$ of the conventional surge protector having no short-circuited structure H. That is, the holding current $I_H$ becomes large.

when a reverse voltage is applied to the surge protector, the protector exhibits only the forward characteristic of the junction $J_2$.

Figure 1B:
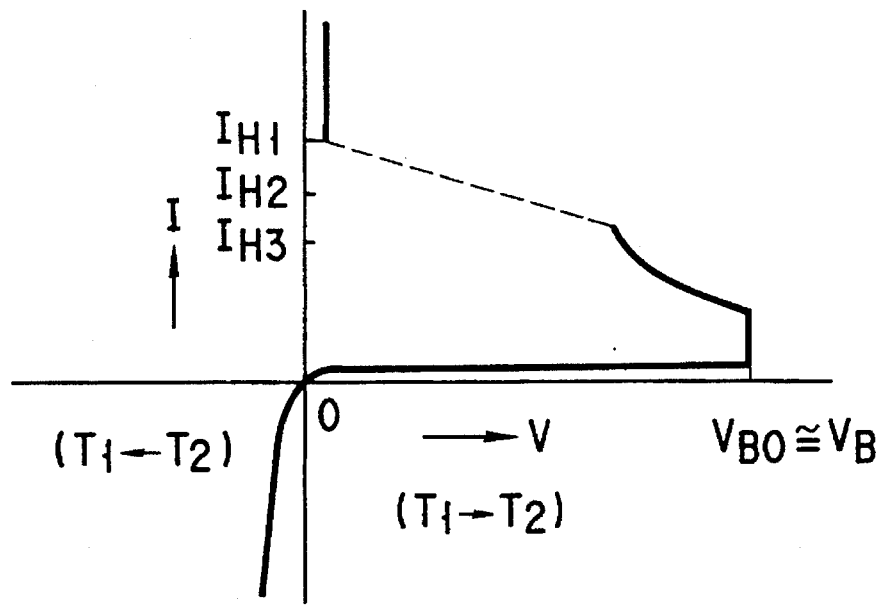
FIG. 1B is a graph showing a characteristic of the semiconductor surge protector shown in FIG. 1.

Accordingly, the surge protector according to the present invention has the voltage-current characteristic shown in FIG. 1B.

As is apparent from the above description, according to the present invention, the following advantages can be obtained.

(1) When the breakdown of the junction $J_2$ occurs to cause the current I to flow through the surge protector, the current I only flows from the short-circuited structure F to the short-circuited structure H through only the junction $J_2$, and no carrier injection occurs. For this reason, the breakdown voltage $V_{BO}$ of the surge protector is defined by the breakdown voltage $V_B$ of the junction $J_2$ to provide the condition given by $V_{BO}=V_B=V_{CL}$.

(2) Since the short-circuited structure H is provided in addition to the short-circuited structure F the effect of recombination to the injected electrons is increased to increase the holding current $I_{H1}$ as compared with each of the holding currents $I_{H2}$ and $I_{H3}$ of the conventional structure.

As described above, since the turn-off operation is started from the portions near the short-circuited structures F and H, the holding current $I_{H1}$ can be increased as the distance L among the short-circuited structures F and H is decreased (as the number of short-circuited structures is increased in the same chip area). When a plurality of short-circuited structures F and H are provided, it is effective that the distance L among short-circuited structures is made to equal to one another.

Further, since the withstand surge current is determined by an effective area except for the short-circuited structures, the surge protector is not affect thereby if the total area of the short-circuited structures F and H is decreased. In addition, since the surge protector is not used in a state wherein a reverse voltage is applied, it is not necessary to increase the area of the short-circuited structure F.

The second embodiment of the present invention will be described below with reference to FIGS. 2A and 2B.

FIG. 2A is a plan view showing a semiconductor surge protector from which an electrode $T_1$ is removed, and FIG. 2B is a sectional view showing the semiconductor surge protector along a line IIB—IIB in FIG. 2A. In this embodiment, referring to FIG. 2A, the short-circuited structures F are provided at five portions of the upper surface as indicated by solid lines, and the short-circuited structures H are disposed at four portions of lower surface as indicated by dotted lines. The distances $L_1$ from the short-circuited structures F to the junction $J_2$ intersecting the upper surface of surge protector are set to be equal to one another, while the distances $L_2$ among the short-circuited structures F and H are set to be equal to one another.

In such a structure, current components $I_1$ and $I_2$ described in the first embodiment are uniformly distributed. Therefore, when the surge protector is turned on, carrier injections from junctions $J_1$ and $J_3$ are uniformly distributed.

In order that the turn-on operation is started from the central portion of the surge protector and is gradually spread to the peripheral portion, the distances $L_1$ and $L_2$ are set to satisfy a condition of $2L_1 \leq L_2$.

A semiconductor surge protector according to the third embodiment of the present invention will be described below with reference to FIGS. 3A and 3B.

FIG. 3A is a plan view showing a semiconductor surge protector from which an electrode $T_1$ is removed, and FIG. 3B is a sectional view showing the semiconductor surge protector along a line IIIB—IIIB in FIG. 3A. In this embodiment, some of short-circuited structures F and H are located at peripheral portions of junctions $J_1$ and $J_3$.

A semiconductor surge protector according to the fourth embodiment of the present invention will be described below with reference to FIGS. 4A and 4B.

Figure 4A:
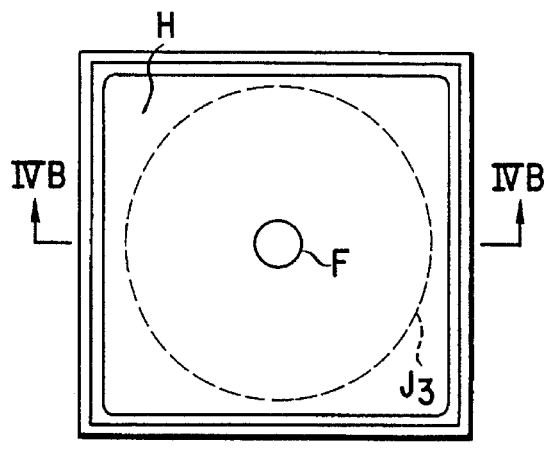
FIG. 4A is a plan view showing a semiconductor surge protector according to a fourth embodiment of the present invention.
Figure 4B:
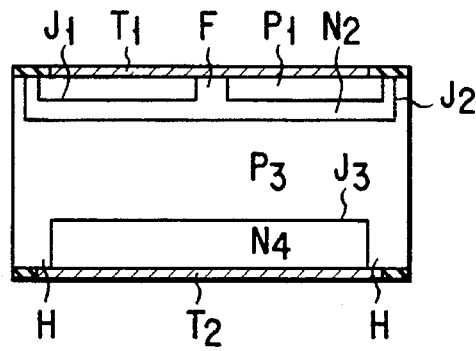
FIG. 4B is a sectional view showing the semiconductor surge protector along a line IVB—IVB in FIG. 4A.

FIG. 4A is a plan view showing a semiconductor surge protector from which an electrode $T_1$ is removed, and FIG. 4B is a sectional view showing the semiconductor surge protector along a line IVB—IVB in FIG. 4A. In this embodiment, one short-circuited structure F is provided at the central portion of the protector, and a short-circuited structure H is provided around the junction $J_3$ as a continuous region. The short-circuited structure H having the large area is provided to the $P_3$ layer normally having a high resistivity to decrease a contact resistance, thereby enhancing the effect of the short-circuited structure H.

A semiconductor surge protector according to the fifth embodiment of the present invention will be described below with reference to FIGS. 5A, 5B, and 5C.

FIGS. 5A, 5B, and 5C are plan views showing semiconductor surge protectors from which electrodes $T_1$ are removed, and show arrangements of short-circuited structures F and H.

In FIG. 5A, short-circuited structures F are provided near inside corners of a square having a desired size, and a short-circuited structure H is formed at the central portion of the square.

In FIG. 5B, each of pairs of the short-circuited structures F and H are arranged on corresponding one of diagonal lines of the square.

In FIG. 5C, the same short-circuited structures F are provided along one side of the square, and the short-circuited structures H are formed along the opposed side thereof.

Figure 6A:
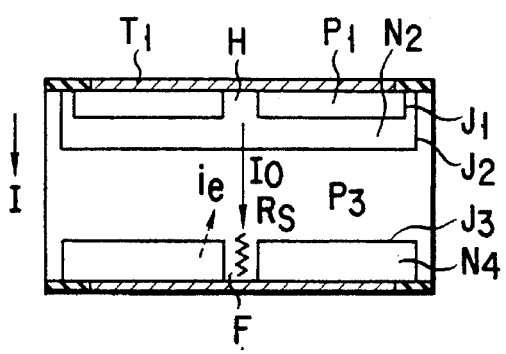
FIG. 6A is a plan view showing a semiconductor surge protector according to the sixth embodiment of the present invention.

A semiconductor surge protector according to the sixth embodiment of the present invention will be described below with reference to FIGS. 6A and 6B.

In the first to fifth embodiments, the short-circuited structures F and H are provided so as not to be opposed to one another, that is, the short-circuited structures F do not overlap the short-circuited structures H to one another. In the embodiment of FIG. 6A, the short-circuited structures F and H are provided so as to be opposed to each other. When a voltage is applied across an electrode $T_1$ and an electrode $T_2$ to breakdown the junction $J_2$, a current $I_0$ flows between the short-circuited structures H and F. At this time, when a spreading resistance $R_S$ of the short-circuited structure F is high, the junction $J_3$ is forward biased by the voltage drop caused by the current $I_0$ and the resistance $R_S$. Therefore, the electron injection ie occurs to turn on the surge protector. In this case, since the $P_3$ layer has a relatively high resistivity, the resistance $R_S$ can be easily increased.

Figure 6B:
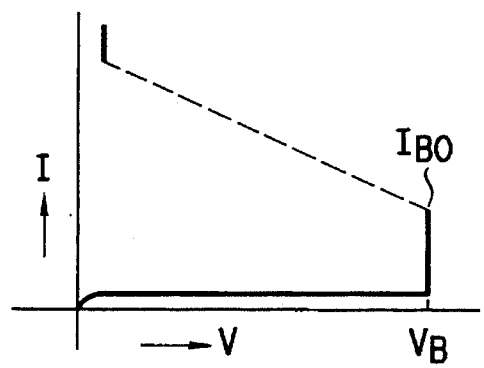
FIG. 6B is a graph showing a characteristic of the semiconductor surge protector shown in FIG. 6A.
Figure 7A:
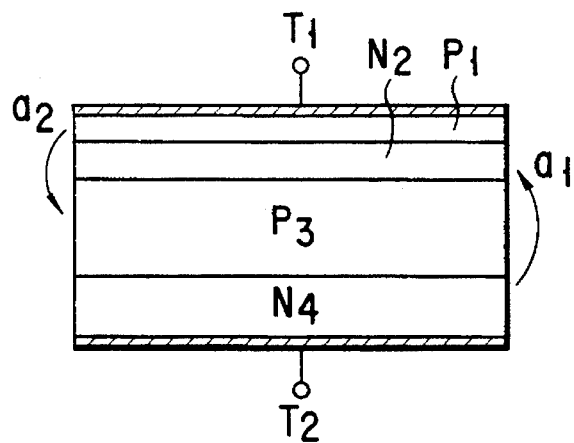
FIGS. 7A and 7B are sectional views showing conventional semiconductor surge protectors.
Figure 7B:
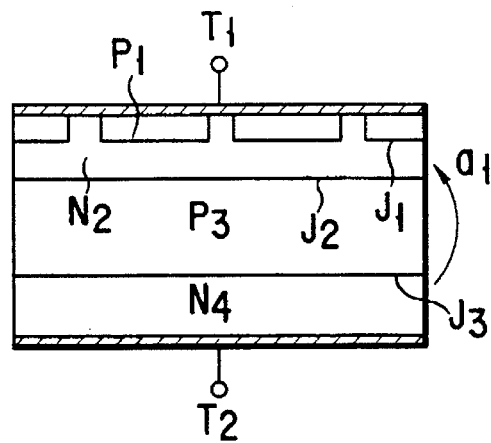
Figure 7C:
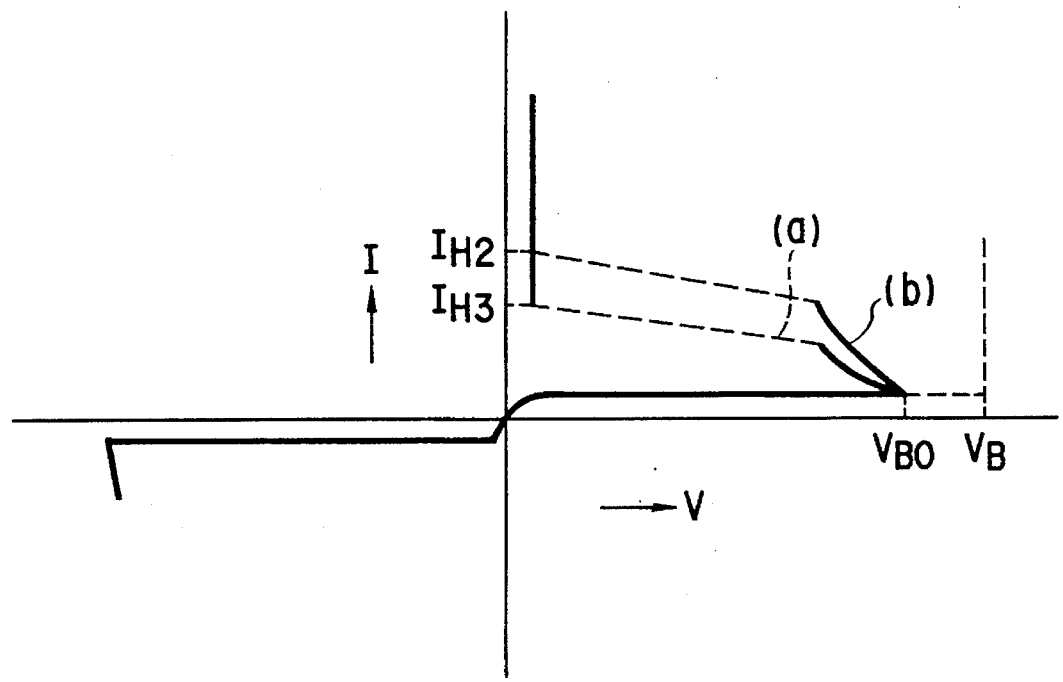
FIG. 7C is a graph showing characteristics of the conventional semiconductor surge protectors.
Figure 8A:
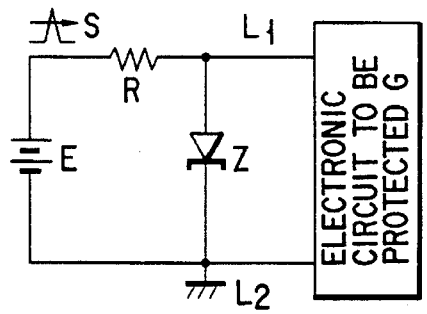
FIGS. 8A to 8C are conventional protection circuits obtained by applying semiconductor surge protectors to electronic circuits to be protected.
Figure 8B:
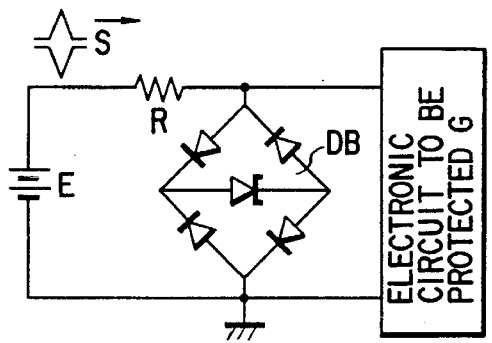
Figure 8C:
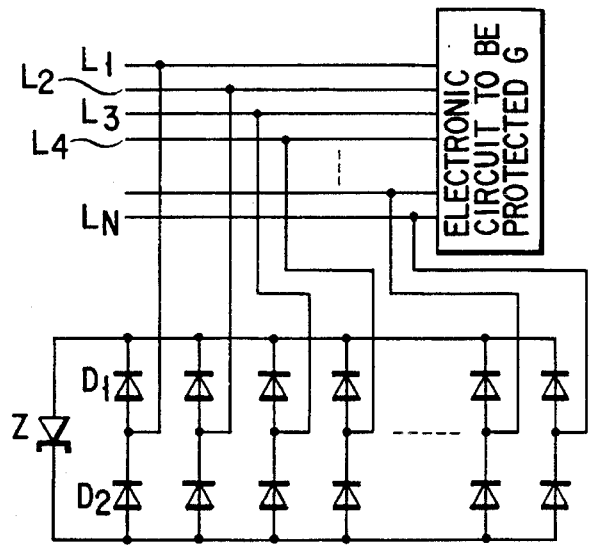

According to the structure, as shown in FIG. 6B, the breakdown voltage $I_{BO}$ is increased, and the surge protector is used in various applications.

According to the present invention, the number, configuration, and arrangement of short-circuited structures can be changed depending on purposes. In the above embodiments, the $P_1N_2P_3N_4$ structure is used. However, even if an $N_1P_2N_3P_4$ structure obtained by reversing the conductivity types of the $P_1N_2P_3N_4$ structure is employed, the same advantages as described above can be obtained.

As is apparent from the above description, according to the present invention, a surge protector having an increased holding current $I_H$ and a small difference between a breakdown voltage $V_{BO}$ and a surge operating voltage $V_{CL}$ can be obtained. The surge protector is used for protecting a communication equipment or other various electronic apparatus from a surge current, thereby obtaining enhanced advantages.

It is further understood by those skilled in the art that the foregoing description is only of the preferred embodiments and that various changes and modifications may be made in the invention without departing from the spirit and scope thereof.

What is claimed is:

1. A semiconductor overvoltage protector comprising:
   a first semiconductor layer of a first conductivity type having first and second surfaces opposed to each other;
   a second semiconductor layer of a second conductivity type provided on said first surface of said first semiconductor layer;
   a third semiconductor layer of said first conductivity type formed in a surface region of said second semiconductor layer so as to provide at least two first exposed portions a surface region of said second semiconductor layer;
   a fourth semiconductor layer of said second conductivity type formed in a second surface region of said first semiconductor layer so as to provide a second exposed portion in said second surface region of said first semiconductor layer;
   a first electrode provided over said third semiconductor layer and said at least two first exposed portions; and
   a second electrode provided over said fourth semiconductor layer and said second exposed portion,
   wherein dimensions of said first and second exposed portions and a lateral distance between said first and second exposed portions are such that, when breakdown of a PN junction between said first and second semiconductor layers occurs, a first current component flows from said at least two first exposed portions to said second exposed portion through a lateral effective resistance of said second semiconductor layer and a second current component flows from said at least two first exposed portions to said second exposed portion through a lateral effective resistance of said first semiconductor layer, thereby to promote minority carrier injections from said third and fourth semiconductor layers, such as to achieve increased holding current and reduced breakover current characteristics.

2. The semiconductor overvoltage protector according to claim 1, wherein said first and second exposed portions are in non-overlapping relation.

3. The semiconductor overvoltage protector according to claim 1, wherein said at least two first exposed portions are opposed to said fourth semiconductor layer, and said second exposed portion is opposed to said third semiconductor layer.

4. The semiconductor overvoltage protector according to claim 1, wherein said first exposed portion and said second exposed portion have different surface areas.

5. The semiconductor overvoltage protector according to claim 1, wherein exposed surfaces of said first and second exposed portions are circular.

6. The semiconductor overvoltage protector according to claim 5, wherein each of the exposed surfaces of said first and second exposed portions has a diameter of 50 to 200 microns.

7. A semiconductor overvoltage protector comprising:
   a first semiconductor layer of a first conductivity type having first and second surfaces opposed to each other;
   a second-semiconductor layer of a second conductivity type provided on said first surface of said first semiconductor layer;
   a third semiconductor layer of said first conductivity type formed in a surface region of said second semiconductor layer so as to provide at least two first exposed portions in a surface region of said second semiconductor layer;
   a fourth semiconductor layer of said second conductivity type formed in a second surface region of said first semiconductor layer so as to provide a second exposed portion in said second surface region of said first semiconductor layer;
   a first electrode provided over said third semiconductor layer and said at least two first exposed portions; and
   a second electrode provided over said fourth semiconductor layer and said second exposed portion,
   wherein said second exposed portion is approximately equidistantly spaced apart from each of said at least two first exposed portions, and
   wherein dimensions of said at least two first exposed portions and said second exposed portion and a lateral distance between each of said at least two first exposed portions and said second exposed portion are such that, when breakdown of a PN junction between said first and second semiconductor layers occurs, a first current component flows from said at least two first exposed portions to said second exposed portion through a lateral effective resistance of said second semiconductor layer and a second current component flows from said at least two first exposed portions to said second exposed portion through a lateral effective resistance of said first semiconductor layer, so as to promote a minority carrier injection from said third and fourth semiconductor layers, thereby to achieve increased holding current and reduced breakover current characteristics.

8. The semiconductor overvoltage protector according to claim 7, wherein said at least two first exposed portions and said second exposed portion are in non-overlapping relation.

9. The semiconductor overvoltage protector according to claim 7, wherein said at least two first exposed portions and said second exposed portion are disposed so as to be opposed to said fourth semiconductor layer and said third semiconductor layer, respectively.

10. The semiconductor overvoltage protector according to claim 7, wherein exposed surfaces of said at least two first exposed portions and an exposed surface of said second exposed portion differ in area.

11. The semiconductor overvoltage protector according to claim 7, including a plurality of said first exposed portions alternately arranged with a plurality said second exposed portions in an X-Y matrix of rows and columns.

12. The semiconductor overvoltage protector according to claim 7, wherein exposed surfaces of said at least two first exposed portions and an exposed surface of said second exposed portion are circular.

13. The semiconductor overvoltage protector according to claim 12, wherein the exposed surfaces of said at least two first and said second exposed portions each have a diameter of 50 to 200 microns.

14. The semiconductor overvoltage protector according to claim 7, wherein said at least two first exposed portions have a quadrant area.

15. The semiconductor overvoltage protector according to claim 7, wherein an exposed surface of said second exposed portion is semicircular.

16. A semiconductor overvoltage protector comprising:

a first semiconductor layer of a first conductivity type;

a second semiconductor layer of a second conductivity type provided on a first surface of said first semiconductor layer;

a third semiconductor layer of a said first conductivity type formed in a surface region of said second semiconductor layer, the third semiconductor layer having a first exposed portion connected to said second semiconductor layer;

a fourth semiconductor layer of said second conductivity type formed in a second surface region of said first semiconductor layer, the fourth semiconductor layer having a second exposed portion connected to said first semiconductor layer, said first exposed portion and said second exposed portion being arranged so as not to lap each other in a lateral or horizontal direction;

a first electrode provided over said third semiconductor layer; and a second electrode provided over said fourth semiconductor layer, wherein when breakdown of a PN junction between said first and second semiconductor layers occurs, a first current component flows from said first exposed portion to said second exposed portion through a lateral effective resistance of said second semiconductor layer and a second current component flows from said first exposed portion to said second exposed portion through a lateral effective resistance of said first semiconductor layer, thereby to promote minority carrier injections from said third and fourth semiconductor layers, such as to achieve increased holding current and reduced breakover current characteristics.

17. A semiconductor overvoltage protector according to claim 16, wherein a plurality of first exposed portions are provided in the surface region of said second semiconductor layer, a plurality of second exposed portions are provided in the second surface region of said first semiconductor layer, and each of said first exposed portions is approximately equidistantly spaced apart from each of said second exposed portions.

18. A semiconductor overvoltage protector according to claim 16, wherein said first exposed portion is located in a center of the surface region of said second semiconductor layer and a plurality of second exposed portions are provided in a periphery of the second surface region of said first semiconductor layer.

19. A semiconductor overvoltage protector according to claim 16, wherein exposed surfaces of said first and second exposed portions are circular.

20. A semiconductor overvoltage protector according to claim 19, wherein each of exposed surfaces of said first and second exposed portions has a diameter of 50 to 200 microns.

* * * * *

UNITED STATES PATENT AND TRADEMARK OFFICE
CERTIFICATE OF CORRECTION

PATENT NO. : 5,483,086
DATED : January 09, 1996
INVENTOR(S) : Koichi OHTA

It is certified that error appears in the above-indentified patent and that said Letters Patent is hereby corrected as shown below:

In the Abstract, title page, last line, before "second" insert --the--.

In Claim 1, column 7, line 44, after "portions" insert --in--.

In Claim 7, column 8, line 24, delete hyphen in "second-semiconductor".

Signed and Sealed this

Seventh Day of January, 1997

Attest:

BRUCE LEHMAN

*Attesting Officer*  *Commissioner of Patents and Trademarks*